US009454090B2

(12) United States Patent
Sun et al.

(10) Patent No.: US 9,454,090 B2
(45) Date of Patent: Sep. 27, 2016

(54) METHODS AND APPARATUSES FOR TEMPLATE COOLING (75) Inventors: Hongqian Sun, Boise, ID (US); Jianming Zhou, Boise, ID (US); Volodymyr Temchenko, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 686 days.

(21) Appl. No.: 13/596,683

(22) Filed: Aug. 28, 2012

(65) Prior Publication Data

US 2014/0063476 A1  Mar. 6, 2014

(51) Int. Cl.
G03B 27/42 (2006.01)
G03B 27/52 (2006.01)
G03F 7/20 (2006.01)

(52) U.S. Cl.
CPC ......... *G03F 7/70716* (2013.01); *G03F 7/7095* (2013.01); *G03F 7/70875* (2013.01); *Y10T 428/24802* (2015.01)

(58) Field of Classification Search
CPC ........... G03F 7/70875; G03F 7/70891; G03F 7/2041
USPC ......................................................... 355/53
See application file for complete search history.

(56) References Cited

U.S. PATENT DOCUMENTS

| 6,098,408 A | 8/2000 | Levinson et al. |
| 6,455,821 B1 | 9/2002 | Stumbo |
| 6,646,720 B2 | 11/2003 | Ramamoorthy et al. |
| 6,806,006 B2 | 10/2004 | Lercel et al. |
| 7,105,836 B2 | 9/2006 | del Puerto et al. |
| 7,283,198 B2 | 10/2007 | Kuo |
| 7,413,341 B1 | 8/2008 | Kachynski et al. |
| 7,413,586 B2 | 8/2008 | Ramamoorthy et al. |
| 7,648,648 B2 | 1/2010 | Bley et al. |
| 2004/0051984 A1 | 3/2004 | Oshino et al. |
| 2004/0079518 A1 | 4/2004 | del Puerto et al. |
| 2004/0180294 A1 | 9/2004 | Baba-Ali et al. |
| 2008/0090726 A1 | 4/2008 | Eskra et al. |
| 2010/0186942 A1 | 7/2010 | Phillips et al. |
| 2010/0321649 A1* | 12/2010 | Baer ............................... 355/30 |
| 2012/0026474 A1 | 2/2012 | Nayfeh |
| 2012/0147906 A1 | 6/2012 | Williams et al. |

OTHER PUBLICATIONS

Carcia et al., Materials Screening for Attenuating Embedded Phase-Shift Photoblanks for DUV and 193 nm Photolithography, 16th Annual BACUS Symposium on Photomask Technology and Management, SPIE vol. 2884 (1996) pp. 255-263.

(Continued)

*Primary Examiner* — Mesfin T Asfaw
(74) *Attorney, Agent, or Firm* — TraskBritt (57) ABSTRACT Disclosed are cooling apparatus and methods of cooling a template. The cooling apparatus includes a reticle and an optical cooling material. The reticle includes patterning for at least partially reflecting patterning radiation incident on a first side of the reticle. The optical cooling material is in thermally-conductive coupling with the reticle mount and is configured to produce cooling when exposed to a laser radiation. More particularly, the optical cooling material includes a glass material that exhibits anti-Stokes fluorescence that produces cooling of the glass material when exposed to an infrared laser beam. In some embodiments, the cooling apparatus may be incorporated with a reticle mount. The reticle mount is in thermally-conductive coupling with a second side of the reticle.

18 Claims, 7 Drawing Sheets

(56) References Cited

OTHER PUBLICATIONS

Edwards et al., Demonstration of a Solid-State Optical Cooler: An Approach to Cryogenic Refrigeration, J. Appl. Phys. vol. 86, Dec. 1, 1999, pp. 6489-6493.

Hoyt et al., Observation of Anti-Stokes Fluorescence Cooling in Thulium-Doped Glass, Physical Review Letters, vol. 85, No. 17, Oct. 23, 2000, pp. 3600-3603.

Mills et al., Optical Cryocooling and the Effects of Dielectric Mirror Leakage, NASA ESTO Conference, Pasadena, CA, 2002, 5 pages.

Qin et al., Multiple-Wavelength Up-Conversion Laser in Tm3+-Doped ZBLAN Glass Fiber, IEEE Photonics Technology Letters, vol. 17, No. 9, Sep. 2005, pp. 1818-1820.

Rayner, Laser Cooling of Solids, Thesis Submitted to the University of Queensland for the Degree of Doctor of Philosophy, Department of Physics, Jan. 2002, 184 pages.

\* cited by examiner

METHODS AND APPARATUSES FOR TEMPLATE COOLING

FIELD

The present disclosure relates generally to lithography templates and, more particularly, to cooling of lithography templates.

BACKGROUND

In the semiconductor industry, there is a continuing trend toward higher device densities. To achieve these high densities there has been, and continues to be, efforts toward scaling down the device dimensions on semiconductor wafers. In order to accomplish such high device packing density, smaller features sizes are required. The requirement of small features with close spacing between adjacent features requires the use of high-resolution lithographic processes. In general, projection lithography refers to processes for pattern transfer between various media. In lithographic processes used for integrated circuit fabrication, a silicon wafer is coated with a radiation-sensitive film and an exposing source (such as light, X-rays, or an electron beam) illuminates selected areas of the surface of the film through an intervening master template (often referred to as a mask or a reticle) for a particular pattern. Once the image is projected, it is indelibly formed in the coating. The projected image may be either a negative or a positive of the subject pattern. Exposure of the coating causes the image area to become selectively patterned in the radiation-sensitive film and consequently either more or less soluble (depending on the coating) in a particular solvent developer. The more soluble areas are removed in the developing process to leave the pattern image in the coating as less soluble polymer. Further processing steps may then be performed (e.g., depositions or adding layers) based on the pattern left on the wafer.

Reticles used in exposure processes often suffer distortion in the presence of heat. When reticles are distorted, the accuracy with which some processes that utilize the reticles are performed may be compromised. Thus, the accuracy of patterning processes using reticles may be compromised. While optics may be used to compensate for some reticle distortions, some distortions may not be corrected using optics. As a result, substantially minimizing the distortion in reticles due to heat may improve the accuracy of processes performed using the reticles.

To compensate for heat-related distortion of reticles, some systems add heat to the reticles during the patterning process in an effort to maintain a substantially uniform temperature across the reticle. By evenly heating the reticles, the effect of thermal distortion of the reticles during patterning may be mitigated. However, adding heat to a reticle that is a part of a lithography system, during a patterning process may be problematic, as the addition of heat may have an adverse effect on other portions of the system. For example, the accuracy with which sensors determine positions of stages and the like may be affected, if the sensors are temperature-sensitive. Further, the addition of heat may place additional burdens on appropriate air temperature control systems.

Other systems may remove heat from the reticle by convection or conduction. By cooling the reticle, the effects of heat on the reticle also may be minimized. However, many lithography systems using Deep Ultraviolet (DUV) and Extreme Ultraviolet (EUV) are performed in a substantial vacuum, making convection cooling impractical. Conduction heating or cooling generally requires physical contact with the reticle and mechanical connections to heat sinks, heat-conductive fluids, or other conduction devices for extracting heat from the reticle. This physical contact can introduce vibrations or other displacements that comprise the accuracy of the patterning process. Moreover, use of such mechanical connections, fluids and devices may require significant changes to reticle mounting hardware.

There is a need for methods and apparatuses for cooling reticles in lithography processes that do not require physical contact with the reticle.

DETAILED DESCRIPTION

In the following description, reference is made to the accompanying drawings in which is shown, by way of illustration, specific embodiments of the present disclosure. The embodiments are intended to describe aspects of the disclosure in sufficient detail to enable those skilled in the art to practice the invention. Other embodiments may be utilized and changes may be made without departing from the scope of the disclosure. The following detailed description is not to be taken in a limiting sense, and the scope of the present disclosure is defined only by the appended claims.

Elements described herein may include multiple instances of the same element. These elements may be generically indicated by a numerical designator (e.g., 110) and specifically indicated by the numerical indicator followed by an alphabetic designator (e.g., 110A) or a numeric indicator preceded by a "dash" (e.g., 110-1). For ease of following the description, for the most part element number indicators begin with the number of the drawing on which the elements are introduced or most fully discussed. For example, where feasible, elements in FIG. 3 are designated with a format of 3xx, where 3 indicates FIG. 3 and xx designates the unique element.

As used herein, any relational term, such as "over," "underlying," "horizontal," "vertical," etc., is used for clarity and convenience in understanding the present disclosure and accompanying drawings and does not connote or depend on any specific preference, orientation, or order, except where the context clearly indicates otherwise.

As used herein, the term "substantially," with reference to a given parameter, property, or condition, means and includes to a degree that one of ordinary skill in the art would understand that the given parameter, property, or condition is met within a degree of variance, such as, for example, within acceptable manufacturing tolerances.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed or that the first element must precede the second element in some manner. In addition, unless stated otherwise, a set of elements may comprise one or more elements.

Embodiments of the present disclosure use optical cooling of a template to mitigate thermal distortions during lithographic exposure. The templates may be reflective-type templates configured for EUV lithography systems or transmissive-type templates configured for DUV lithography systems and may be referred to herein as both masks and reticles. Generally, EUV lithography systems use wavelengths of about 13.5 nanometers and DUV lithography systems use wavelengths of about 193 nanometers. However, embodiments of the present disclosure may be used at a variety of wavelengths within EUV and DUV lithography systems.

Figure 1:
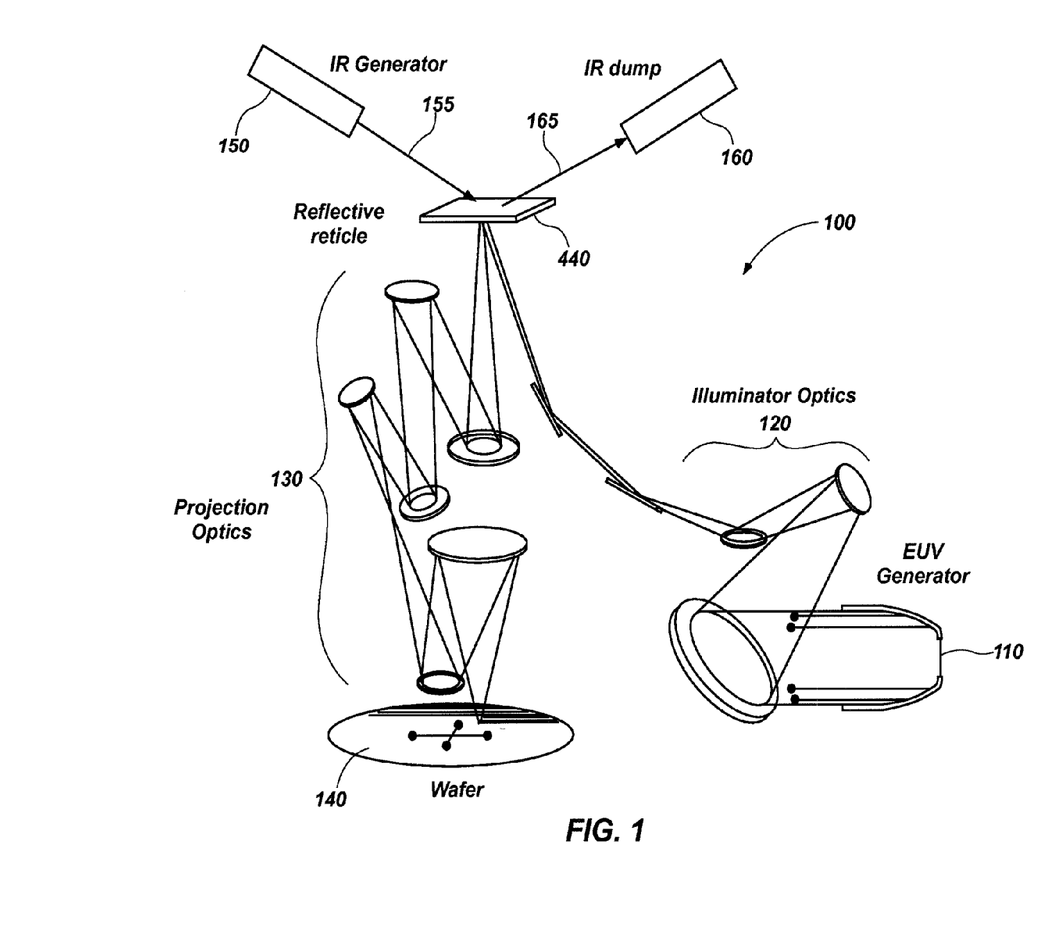
FIG. 1 illustrates an EUV lithography system.

FIG. 1 illustrates an EUV lithography system 100. EUV light (may also be referred to herein as "patterning radiation") is emitted from an EUV generator 110 and may be reflected by one or more optical elements referred to collectively as illuminator optics 120. The illuminator optics 120 direct EUV light to a reflective reticle 440. The reticle 440 defines features of a pattern to be transferred from the reticle 440 to a substrate 140 (e.g., a resist-coated semiconductor wafer). Light reflected from the reticle 440 carries an image of the pattern defined on the reflective reticle 440 and is projected by projection optics 130 onto the substrate 140. As the beam from the projection optics 130 is incident on the substrate 140, an actual image of the illuminated portion of the reticle 440 is farmed and imprinted on the substrate 140.

Most substances absorb the wavelength of EUV light emitted from the EUV generator 110. Consequently, an EUV optical system, unlike the refractive optical system used in DUV optical systems, uses a reflective optical system that comprises multiple reflective mirrors in the illuminator optics 120 and the projection optics 130. Moreover, the reticle 440 reflects the EUV light (except for the patterned areas) rather than transmitting light, as in DUV lithography systems.

An infrared (IR) generator 150 generates infrared laser radiation 155 to impinge on a back side of a reticle mount (not shown) holding the reticle 440. An infrared dump 160 collects most of the reflected infrared radiation 165 both at the incident wavelength and at a shifted wavelength as explained below. The infrared laser radiation 155 and the reflected infrared radiation 165 are illustrated as beams directed at, and reflecting from the back side of the reticle mount. However, the infrared laser radiation 155 may be directed and collected in a variety of ways as discussed below.

Figure 2:
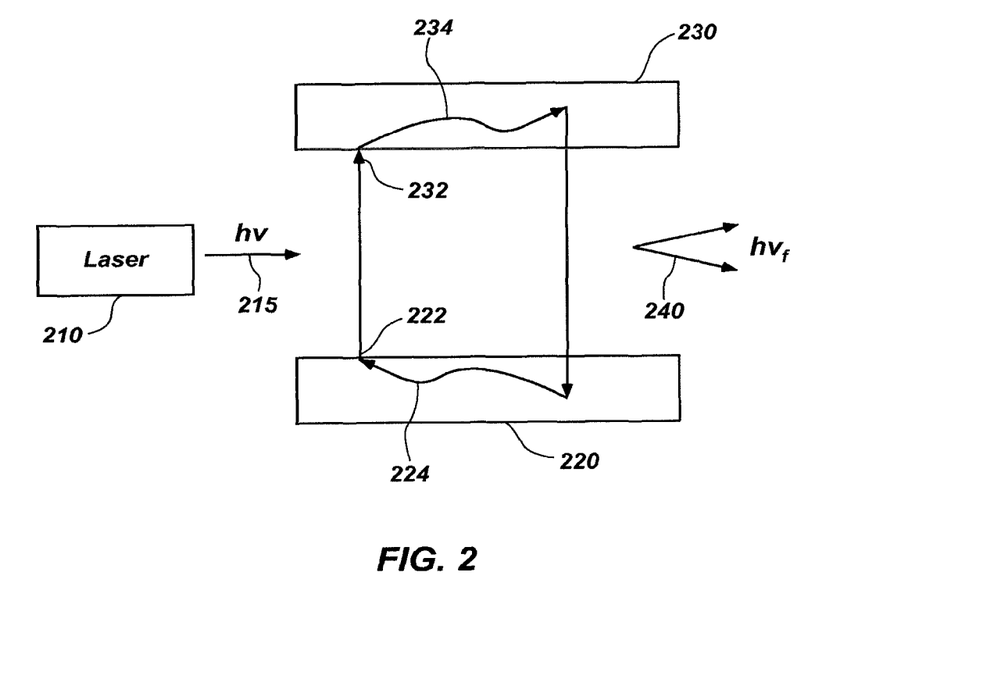
FIG. 2 illustrates energy levels in a photon-phonon cooling cycle.

FIG. 2 illustrates energy levels in a photon-phonon cooling cycle using anti-Stokes fluorescence. In general, anti-Stokes fluorescence can cause optical cooling (also referred to herein as "fluorescent cooling") in certain materials that are exposed to infrared laser radiation. Non-limiting examples of such materials are doped glass materials such as ZBLAN ($ZrF_4$—$BaF_2$—$LaF_3$—$AlF_3$—NaF) and ZPLANP ($ZrF_4$—$BaF_2$—$LaF_3$—$AlF_3$—NaF—$PbF_2$). Ytterbium-doped ZBLAN (Yb:ZBLAN), ytterbium-doped ZBLANP (Yb:ZBLANP), and thulium-doped ZBLANP (Tm:ZBLANP) have all been shown to create optical cooling when exposed to infrared laser radiation. These glass materials may be generally referred to herein as optical cooling material.

The basic cycle of fluorescent cooling is simple. In the case of Yb:ZBLAN material, the presence of the internal electric fields of the host ZBLAN material cause the ground and excited states of the $Yb^{3+}$ ion to be split into multilevel manifolds, shown as a ground-state manifold 220 and an excited-state manifold 230. A photon 215 from a laser 210 at the appropriate wavelength may be absorbed by an ion that has been thermally excited to the highest level 222 of the ground-state manifold 220. This absorption may promote that ion to the lowest level 232 of the excited-state manifold 230. When that ion decays through spontaneous emission (i.e., fluorescence) from the excited-state manifold 230, it can fall to any of the levels in the ground-state manifold 220. The ions may thermalize and change levels (224 and 234) within each of the ground-state manifold 220 and the excited-state manifold 230. Generally, the outgoing fluorescent photon 240 will, therefore, carry slightly more energy than the pump photon that was absorbed. Since the absorption occurs with ions at the highest level 222 of the ground-state manifold 220, the population of ions at the highest level 222 can be depleted. Thermal equilibrium is established by another ion absorbing a phonon from the host material and being promoted to a higher level and eventually reaching the highest level 222 of the ground-state manifold 220. This phonon absorption is what causes the cooling effect in the optical cooling material. In summary, a dopant ion absorbs a pump photon at a longer wavelength (e.g., about 1.03 microns) and the photon is emitted at a slightly shorter wavelength (e.g., about 1.0 microns). The energy difference from the emitted photon comes from thermal vibrations (i.e., phonons) of the host material. In general, the pump photons may be generated by an infrared laser with wavelengths between about one micron and two microns.

For each absorbed pump photon 215 of energy (hv), an average energy ($hv_f$-hv) is removed from the glass as cooling due to thermal vibrations in the glass. The cooling efficiency can be defined as the ratio of cooling power to absorbed power and can be expressed as: $\eta_{cooling}=((v_f-v)/v)=((\lambda-\lambda_f)/\lambda_f)$.

Thus, some embodiments include a method of cooling a template, comprising exposing a glass cooling material selected from the group consisting of Yb:ZBLAN, Yb:ZBLANP, and Tm:ZBLANP, and in thermally conductive coupling with the template, to infrared radiation.

Figure 3A:
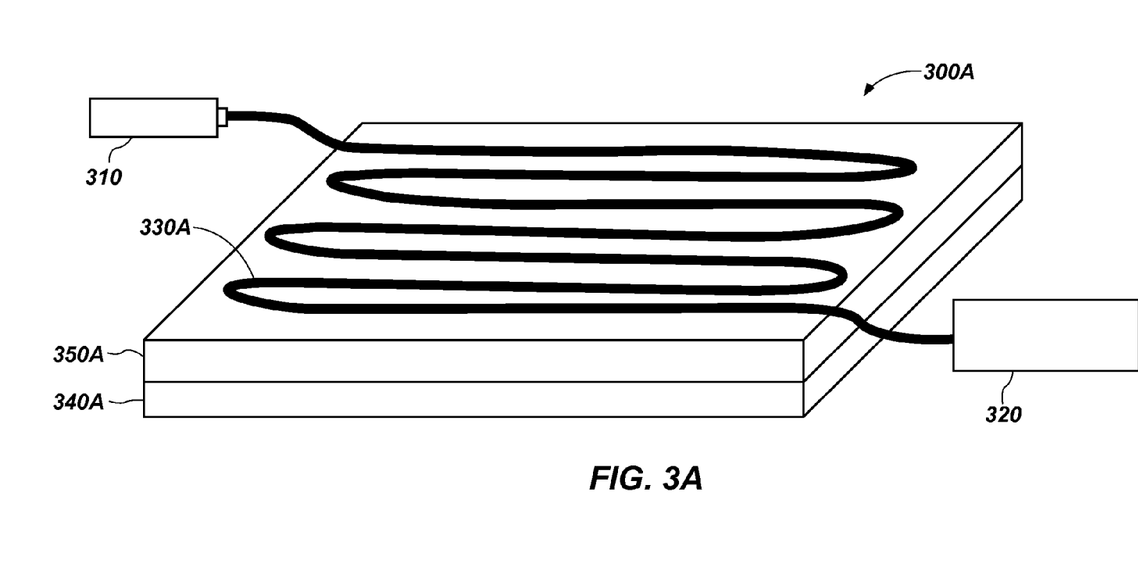
FIG. 3A illustrates a cooling apparatus including a reticle mount with an optical fiber disposed on a back side of the reticle mount.
Figure 3B:
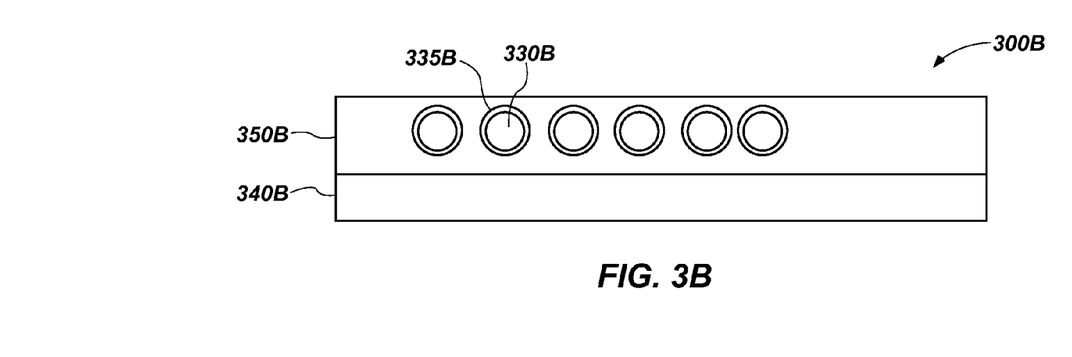
FIG. 3B illustrates a cooling apparatus including a waveguide disposed within a reticle mount.
Figure 4:
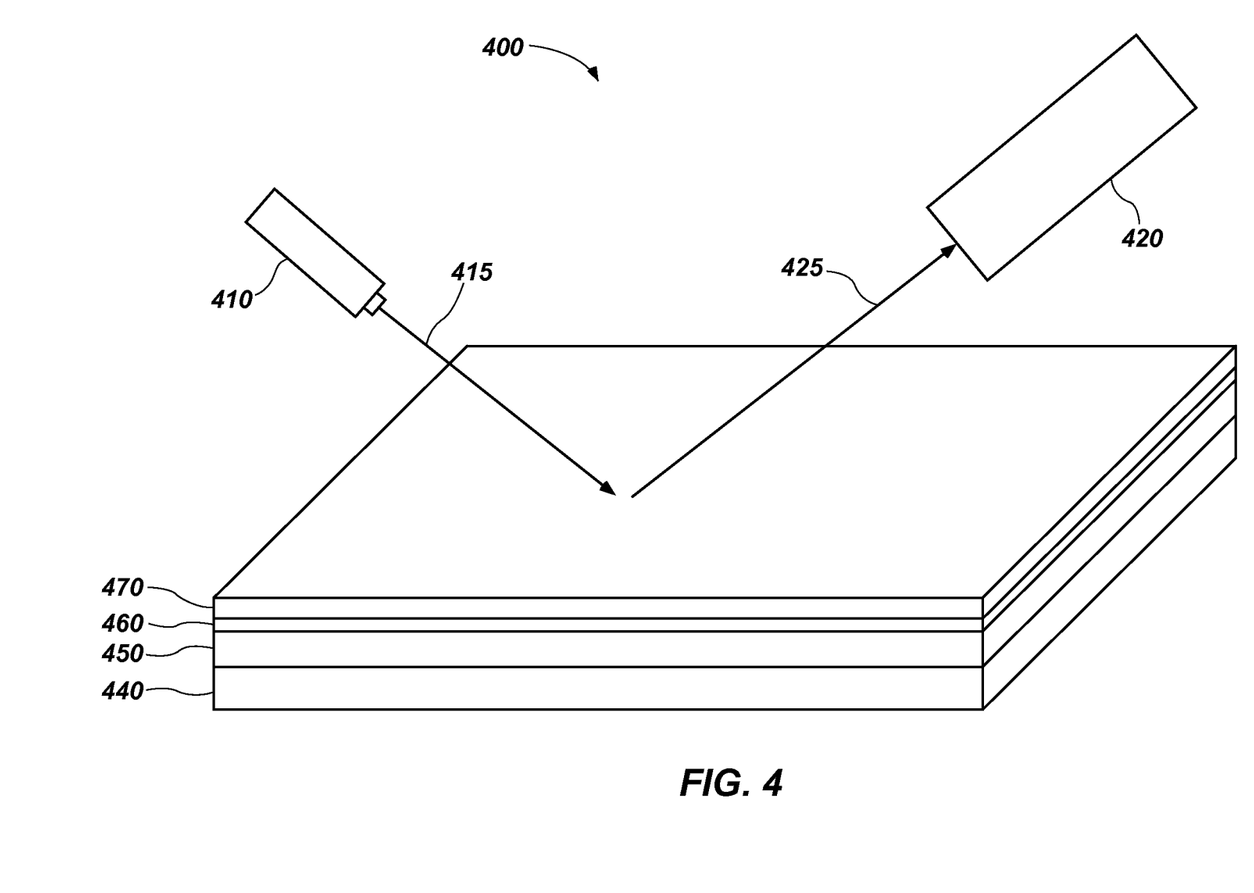
FIG. 4 illustrates a cooling apparatus including a reticle mount with an optical cooling material disposed on a back side of the reticle mount.

FIGS. 3A, 3B, and 4 illustrate a cooling apparatus including a reticle, a reticle mount, and an optical cooling material. The reticle includes patterning for at least partially reflecting patterning radiation incident on a first side of the reticle. The reticle mount is in thermally-conductive coupling with a second side of the reticle. The optical cooling material is in thermally-conductive coupling with the reticle mount and is configured to produce a cooling effect when exposed to a laser radiation.

Methods for cooling an optical element of a lithographic process are also discussed in connection with FIGS. 3A, 3B, and 4. The methods include exposing an optical cooling material ion thermally-conductive coupling with a template mount to a laser radiation to reduce a temperature of the optical cooling material, the template mount, and a template in thermally-conductive coupling with the template mount.

FIG. 3A illustrates a cooling apparatus 300A including a reticle mount 350A with an optical fiber 330A (which may also be referred to herein as a light guiding fiber 330A) disposed on a back side of the reticle mount 350A.

An infrared laser 310 generates infrared laser radiation that is transmitted through the optical fiber 330A. The optical fiber 330A is configured as an optical cooling material, as discussed above with reference to FIG. 2, such that the optical fiber 330A cools when infrared laser radiation passes through the optical fiber 330A. An infrared dump 320 collects infrared radiation at the original frequency and shifted frequency, and may generally be configured to be non-reflective for infrared wavelengths (to avoid any incident beams from being reflected back) and avoid overheating.

The optical fiber 330A is in thermally-conductive coupling with the reticle mount 350A such that the cooling effect from the optical fiber 330A may be transmitted to the reticle mount 350A. The reticle mount 350A is in thermally-conductive coupling with a reticle 340A such that the cooling effect provided by the optical fiber 330A in the reticle mount 350A may be utilized to transfer heat from the reticle 340A, thus cooling the reticle 340A.

FIG. 3B illustrates a cooling apparatus 300B including a waveguide 330B (which may also be referred to herein as a light guiding structure 330B) disposed within a reticle mount 350B. The waveguide 330B is configured as an optical cooling material as discussed above. A cross-section view is illustrated in FIG. 3B. While not shown, the waveguide 330B may be configured in a serpentine fashion similar to that shown for the optical fiber 330A of FIG. 3A. An infrared laser (not shown in FIG. 3B, but similar to that of FIG. 3A) is coupled to one end of the waveguide 330B and an infrared dump (not shown in FIG. 3B, but similar to that of FIG. 3A) is coupled to the other end of the waveguide 330B. The waveguide 330B cools as infrared radiation is emitted through the waveguide 330B, as discussed above with reference to FIG. 2.

The waveguide 330B is in thermally-conductive coupling with the reticle mount 350B such that the cooling effect provided by the waveguide 330B may be utilized by the reticle mount 350B. The reticle mount 350B is in thermally-conductive coupling with a reticle 340B such that the cooling in the reticle mount 350B may be used to transfer heat from the reticle 340B, thus cooling the reticle 340B.

In the embodiments of FIGS. 3A and 3B, the optical fiber 330A and the waveguide 330B may be clad with an infrared reflective material 335B (not shown for the optical fiber 330A). The cladding material may be selected to reduce possible leakage from the optical fiber 330A and the waveguide 330B and to help with thermal conduction. Many metals have characteristics that are both infrared reflective and thermally conductive. Details of infrared reflective capabilities for some non-limiting examples of metals are discussed below with reference to FIGS. 5A, 5B, 6A, and 6B.

In the embodiments of FIGS. 3A and 3B, a duty cycle of the infrared radiation may be modulated to cause a desired amount of cooling. Moreover, the infrared laser 310 may be included in an adaptive loop with a sensor for sensing temperature (not shown) of the reticle (340A and 340B) or reticle mount (350A and 350B) to adjust the duty cycle to maintain a desired temperature, or a desired temperature range. In addition, the infrared laser 310 and infrared dump 320 may be positioned outside of a processing chamber with only fiber optic connections extending through a wall of the chamber to couple to the optical fiber 330A or waveguide 330B.

FIG. 4 illustrates a cooling apparatus 400 including a reticle mount 450 with an optical cooling material 470 disposed on a back side of the reticle mount 450 and a reticle 440 disposed on a front side of the reticle mount 450. The reticle mount 450 and the reticle 440 are in thermally-conductive coupling to enable heat transfer between reticle mount 450 and reticle 440. Similarly, the reticle mount 450 and the optical cooling material 470 are in thermally-conductive coupling to enable heat transfer between reticle mount 450 and optical cooling material 470.

One or more infrared lasers 410 are employed to direct infrared radiation 415 at the surface of the optical cooling material 470. One or more infrared dumps 420 may be positioned to absorb reflected and emitted infrared radiation 425 from the optical cooling material 470 as discussed above with reference to FIG. 2. The infrared radiation 415 incident on the optical cooling material 470 will cause the optical cooling material 470 to cool. Conductive heat transfer between the optical cooling material 470 and the reticle mount 450 will cause the reticle mount 450 to cool. Finally, conductive heat transfer between the reticle mount 450 and the reticle 440 will cause the reticle 440 to cool.

The infrared radiation 415 may be directed at different incident angles to optimize the cooling effect in the optical cooling material 470 as well as to recapture reflected and emitted infrared radiation 425. In general, the infrared radiation (415 and 425) may be aimed to be away from the EUV optical paths, as illustrated in FIG. 1. In addition, since both the incident and up-converted infrared radiation (415 and 425) have wavelengths much longer than the EUV optical paths, the infrared radiation (415 and 425) should not affect the lithography process performance. However, the infrared dumps 420 may still assist to keep infrared radiation (415 and 425) away from EUV optical components that may absorb some of the infrared radiation (415 and 425), which radiation could cause warping or other physical shape changes to the EUV optical components and result in patterning degradation.

A duty cycle of the infrared radiation 415 may be modulated to cause a desired amount of cooling. Moreover, the infrared laser 410 may be included in an adaptive loop with a sensor for sensing temperature (not shown) of the reticle 440 or reticle mount 450 to adjust the duty cycle to maintain a desired temperature. In addition, the infrared laser 410 and infrared dump 420 may be positioned outside of a processing chamber.

The infrared radiation 415 may be directed to sweep over most, or the entire surface, of the optical cooling material 470 to provide uniform cooling to the reticle 440. However, in some cases, patterning on the reticle 440 may cause hot spots to be present in the reticle 440. In such cases, the infrared radiation 415 may be directed to sweep hot spots more often, to only sweep hot spots, or to provide a higher duty cycle for the hot spots. Moreover, a thermal map depicting varying levels of heat generated by the lithography process may be developed to create a corresponding cooling map for the infrared radiation 415 to follow.

In some embodiments, an infrared reflective layer 460 may be disposed between the optical cooling material 470 and the reticle mount 450. The infrared reflective layer 460 may be any material that is infrared-reflective and thermally conductive. As non-limiting examples, many metals may be suitable, such as, for example, aluminum and gold. With good thermal conduction properties, the infrared reflective layer 460 will introduce minimal interference in heat transfer between the optical cooling material 470 and the reticle mount 450.

Figure 5A:
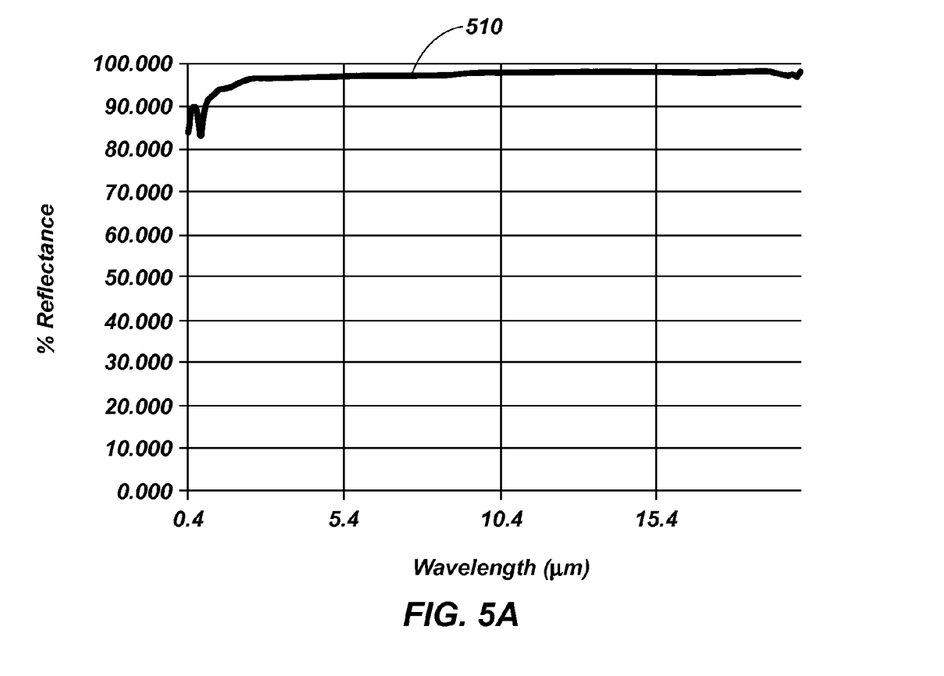
FIGS. 5A and 5B are graphs illustrating a reflectance of aluminum over a range of wavelengths and at different incident angles.
Figure 5B:
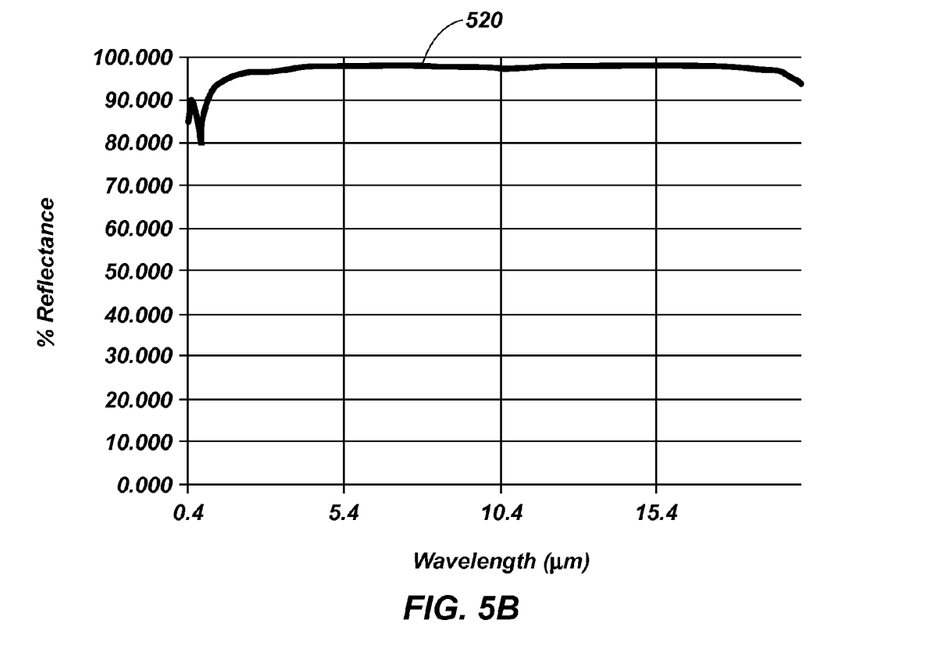

FIGS. 5A and 5B are graphs illustrating a reflectance of aluminum over a range of wavelengths at different incident angles. FIG. 5A illustrates reflectance properties 510 of aluminum with an incident angle of about 8 degrees. FIG. 5B illustrates reflectance properties 520 of aluminum with an incident angle of about 45 degrees. As can be seen, both incident angles provide well over 90% reflection in the wavelengths of interest between about one micron and two microns.

Figure 6A:
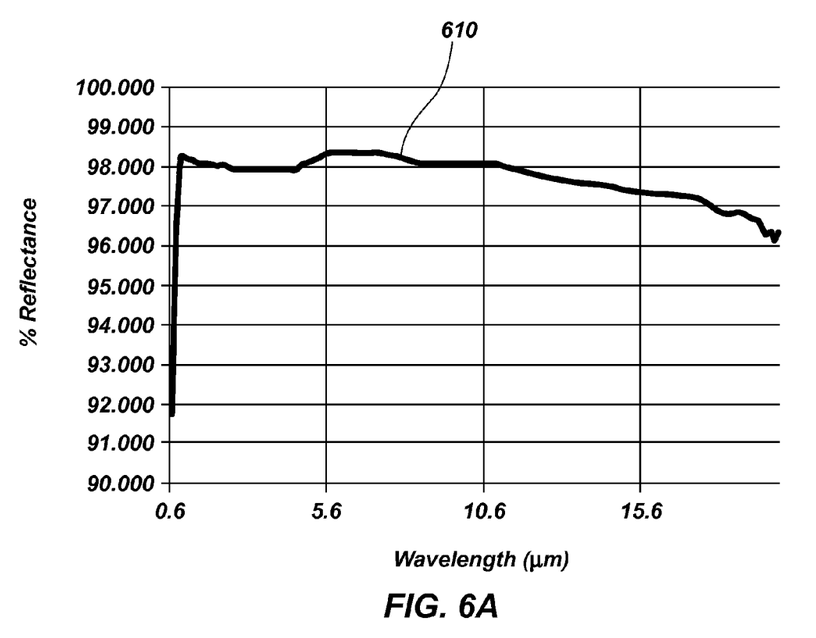
FIGS. 6A and 6B are graphs illustrating a reflectance of gold over a range of wavelengths and at different incident angles.
Figure 6B:
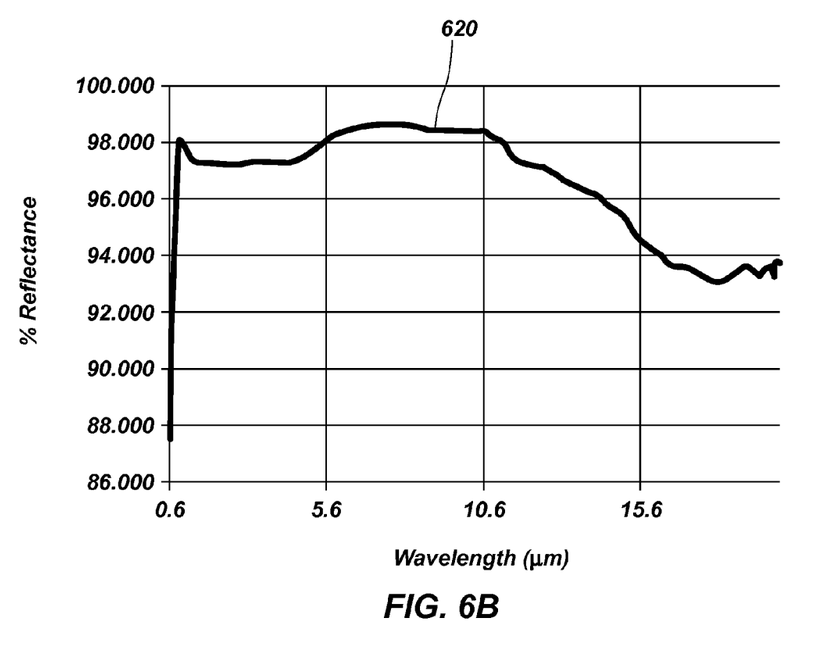

FIGS. 6A and 6B are graphs illustrating a reflectance of gold over a range of wavelengths at different incident angles. FIG. 6A illustrates reflectance properties 610 of gold with an incident angle of about 8 degrees. FIG. 6B illustrates reflectance properties 620 of gold with an incident angle of about 45 degrees. As can be seen, both incident angles provide well over 90% reflection in the wavelengths of interest between about one micron and two microns.

Figure 7:
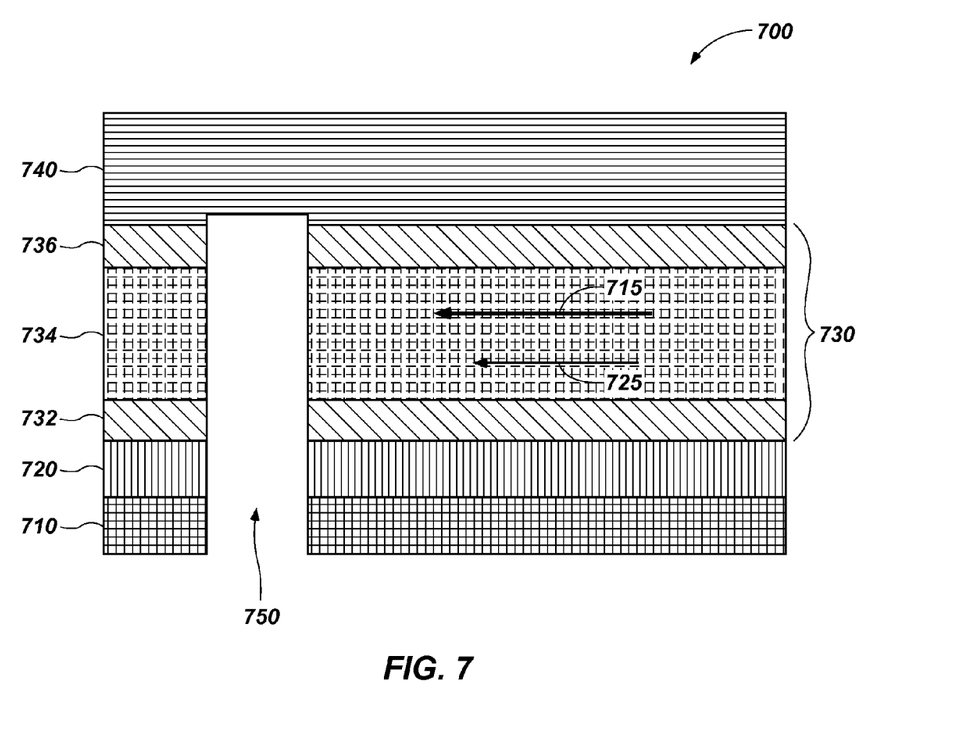
FIG. 7 illustrates a cross-section of a cooling apparatus including a reticle with an infrared guiding structure embedded between layers of the reticle.

FIG. 7 illustrates a cross-section of a cooling apparatus including a template 700 with an infrared guiding structure 730 embedded between layers of the template 700. As a non-limiting example, the template 700 may be referred to as a mask 700 or a reticle 700.

In connection with FIG. 7, as well as some embodiments of FIGS. 3A, 3B, and 4, a cooling apparatus includes a reticle that includes a reticle substrate, an opaque material over the reticle substrate, and a phase-shift material between the reticle substrate and the opaque material. A light guiding structure is disposed between the reticle substrate and the opaque layer. The light guiding structure includes a glass material disposed between a first infrared reflective material and a second infrared reflective material. The glass material is configured for producing cooling when exposed to infrared radiation. A pattern of cavities is formed through the opaque material and the phase-shift material.

Also, in connection with FIG. 7, as well as some embodiments of FIGS. 3A, 3B, and 4, methods of forming a cooling reticle are disclosed. The method includes forming a phase-shift material over a reticle substrate and forming an opaque material over the phase-shift material. An infrared guiding structure is formed between the reticle substrate and the opaque material by forming a first infrared reflective material, forming an optical cooling material over the first infrared reflective material, and forming a second infrared reflective material over the optical cooling material. A pattern of cavities is formed through the opaque material and the phase-shift material.

In FIG. 7, a reticle 700 of such a configuration is suitable for use with DUV lithography processes. In DUV lithography, the DUV radiation is transmitted through the reticle 700 rather than reflected from the reticle, as in EUV lithography.

The reticle 700 includes a reticle substrate 740, a phase-shift material 720, and an opaque material 710. The infrared guiding structure 730 is disposed between the reticle substrate 740 and the opaque material 710. In FIG. 7, the infrared guiding structure 730 is illustrated as located between the reticle substrate 740 and the phase-shift material 720. However, other embodiments may include the infrared guiding structure 730 located between the phase-shift material 720 and the opaque material 710. Materials 710, 720 and 740 may be configured as substantially planar layers.

The reticle substrate 740 may be a material such as quartz, although alternatively the reticle substrate 740 may comprise other materials, such as fluorinated quartz, calcium fluoride, hafnium oxide, BOROFLOAT® or soda lime glass, as examples.

The phase-shift material 720 may be an oxide of MoSi, although other materials may also be used. For example, in other embodiments, the phase-shift material 720 may comprise TaSiO, TiSiN, TaSiN, TaN, ZrSiO or combinations thereof.

The opaque material 710 may be a material such as, for example, chromium (Cr). The opaque material 710 may also comprise other metals or metallic compounds such as Ta, TaN, Au, Ti, Ga, W, Ni, Sn, $SnO_2$, or other materials such as Si, Ge, C, and $Si_3N_4$. In addition, the opaque material 710 may be configured as a single layer or as a multi-layer stack.

A pattern of cavities 750 is formed through the opaque material 710, the phase-shift material 720, and the infrared guiding structure 730 to create the desired lithographic pattern for the reticle 700. A suitable material stack should have a suitable combination of transmittance and refractive indices for effective optical transmittance in a DUV lithography process.

The infrared guiding structure 730 includes an optical cooling material 734 disposed between a first infrared reflective material 732 and a second infrared reflective material 736. Materials 732, 734 and 736 may be configured as substantially planar layers. The optical cooling material 734 comprises a material as discussed above with reference to FIG. 2. Infrared radiation 715 is transmitted through the optical cooling material 734 to generate the cooling effect, which will transfer throughout the various materials of the reticle 700. Up-converted infrared radiation 725 resulting from the cooling process is also transmitted through the infrared guiding structure 730.

The first infrared reflective material 732 and the second infrared reflective material 736 are any suitable metal that is thermally conductive and infrared reflective as discussed above with reference to FIGS. 4, 5A, 5B, 6A, and 6B. Thus, the first infrared reflective material 732 and the second infrared reflective material assist in keeping the infrared radiation (715 and 725) within the infrared guiding structure 730 and away from the other materials of the reticle 700. In addition, the first infrared reflective material 732 and the second infrared reflective material 736 assist in thermal transfer of the cooling in the optical cooling material 734 to the other materials of the reticle 700.

As discussed above, a reticle 700 may include hot spots, which may require a larger cooling effect. To that end, the infrared guiding structure 730 may be patterned to be present only in certain areas that may require more cooling. In addition, while the infrared guiding structure 730 is illustrated as a layer in FIG. 7, it may also be configured as an optical fiber in a manner similar to that of FIG. 3A and the optical fiber may be configured and routed to correspond to hot spots indicated by a predicted thermal map for the reticle 700. The optical fiber may be embedded in a suitable material configured to create a substantially planar cooling structure for the overall reticle 700. As a non-limiting example, the infrared reflective material discussed above may be used to create a cooling structure with the optical fiber embedded therein.

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed, including legal equivalents. In addition, features from one embodiment may be combined with features of another embodiment while still being encompassed within the scope of the invention.

What is claimed is:

1. A cooling apparatus, comprising:
   a template having a first major surface and a second major surface opposite the first major surface, the template including patterning on the first major surface thereof for at least partially reflecting patterning radiation incident on the first major surface of the template;
   a template mount having a first major surface and a second major surface opposite the first major surface, the first major surface of the template mount thermally coupled with the second major surface of the template; and
   an optical cooling material comprising an optical fiber thermally coupled with the second major surface of the template mount, wherein the optical fiber is configured to produce a cooling effect when the exposed second major surface of the optical cooling material is exposed to a radiation.

2. The cooling apparatus of claim 1, wherein the optical cooling material comprises a glass material formed on the second major surface of the template mount, wherein the glass material is configured to produce the cooling effect when exposed to infrared laser radiation.

3. The cooling apparatus of claim 2, further comprising an infrared-reflective and thermally conductive material disposed between the glass material and the second major surface of the template.

4. The cooling apparatus of claim 1, wherein the optical cooling material comprises a glass material selected from the group consisting of Yb:ZBLAN, Yb:ZBLANP, and Tm:ZBLANP.

5. The cooling apparatus of claim 1, further comprising at least one infrared laser configured to generate the radiation with a wavelength between about one micron and about two microns.

6. The cooling apparatus of claim 1, wherein the template comprises a mask.

7. The cooling apparatus of claim 1, wherein the template comprises a reticle.

8. A method for cooling an optical element of a lithographic process, comprising:
   applying a radiation to an optical cooling material comprising an optical fiber in thermally conductive coupling with a template mount to reduce a temperature of the optical fiber, the template mount, and a template in thermally conductive coupling with the template mount.

9. The method of claim 8, wherein the optical cooling material comprises an infrared reflective cladding material on the optical fiber.

10. The method of claim 8, wherein applying the radiation to the optical cooling material comprising an optical fiber comprises generating an infrared radiation with a wavelength between about one micron and about two microns.

11. A cooling apparatus, comprising:
    a template comprising a template substrate, an opaque material over the template substrate, and a phase-shift material between the template substrate and the opaque material;
    an optical fiber disposed between the template substrate and the opaque material, the optical fiber comprising a glass material configured for producing cooling when exposed to infrared radiation and disposed between a first infrared reflective material and a second infrared reflective material; and
    a pattern of cavities formed through the opaque material and the phase-shift material.

12. The cooling apparatus of claim 11, wherein the optical fiber is disposed between the template substrate and the phase-shift material.

13. The cooling apparatus of claim 11, wherein the optical fiber is disposed between the phase-shift material and the opaque material.

14. The cooling apparatus of claim 11, wherein the glass material comprises a material selected from the group consisting of Yb:ZBLAN, Yb:ZBLANP, and Tm:ZBLANP.

15. The cooling apparatus of claim 11, wherein the first infrared reflective material and the second infrared reflective material each comprise a material selected from the group consisting of gold and aluminum.

16. The cooling apparatus of claim 11, wherein the template comprises a mask and the template substrate comprises a mask substrate.

17. The cooling apparatus of claim 11, wherein the template comprises a reticle and the template substrate comprises a reticle substrate.

18. A method of forming a cooling template, comprising:
    forming a phase-shift material over a template substrate;
    forming an opaque material over the phase-shift material;
    forming an infrared guiding structure comprising an optical fiber between the template substrate and the opaque material; and
    forming a pattern of cavities through the opaque material and the phase-shift material.

* * * * *

UNITED STATES PATENT AND TRADEMARK OFFICE
CERTIFICATE OF CORRECTION

PATENT NO. : 9,454,090 B2
APPLICATION NO. : 13/596683
DATED : September 27, 2016
INVENTOR(S) : Hongqian Sun, Jianming Zhou and Volodymyr Temchenko Page 1 of 1

It is certified that error appears in the above-identified patent and that said Letters Patent is hereby corrected as shown below:

In the specification:
    COLUMN 3,   LINE 43,     change "is farmed and" to --is formed and--

Signed and Sealed this
Eighth Day of November, 2016

Michelle K. Lee
*Director of the United States Patent and Trademark Office*